United States Patent
Dirks et al.

(10) Patent No.: US 7,958,473 B2
(45) Date of Patent: Jun. 7, 2011

(54) METHOD AND COMPUTER PROGRAM FOR CONFIGURING AN INTEGRATED CIRCUIT DESIGN FOR STATIC TIMING ANALYSIS

(75) Inventors: Juergen Dirks, Holzkirchen (DE); Udo Elsholz, Munich (DE); Stephan Habel, Berg (DE); Ansgar Bambynek, Munich (DE)

(73) Assignee: LSI Corporation, Milpitas, CA (US)

( * ) Notice: Subject to any disclaimer, the term of this patent is extended or adjusted under 35 U.S.C. 154(b) by 525 days.

(21) Appl. No.: 12/117,760

(22) Filed: May 9, 2008

(65) Prior Publication Data
US 2008/0216035 A1   Sep. 4, 2008

Related U.S. Application Data

(63) Continuation-in-part of application No. 11/364,142, filed on Feb. 27, 2006, now abandoned.

(51) Int. Cl.
*G06F 17/50* (2006.01)

(52) U.S. Cl. .......... 716/108; 716/113; 716/134
(58) Field of Classification Search .......... 716/103–108, 716/113–114, 132–134
See application file for complete search history.

(56) References Cited

U.S. PATENT DOCUMENTS

| | | | |
|---|---|---|---|
| 6,324,678 B1 * | 11/2001 | Dangelo et al. | 716/18 |
| 2004/0128641 A1 * | 7/2004 | Broberg et al. | 716/18 |

* cited by examiner

*Primary Examiner* — Paul Dinh
(74) *Attorney, Agent, or Firm* — Luedeka, Neely & Graham, P.C.

(57) ABSTRACT

A method and a computer program for configuring an integrated circuit design for static timing analysis include receiving module data representative of a hierarchy of modules in an integrated circuit design. A configuration item is selected from a list of configuration items for at least one of the modules. The module data is configured for the module from the selected configuration item into a static timing analysis scenario for performing a static timing analysis of the configured module data.

12 Claims, 6 Drawing Sheets

METHOD AND COMPUTER PROGRAM FOR CONFIGURING AN INTEGRATED CIRCUIT DESIGN FOR STATIC TIMING ANALYSIS

CROSS REFERENCE TO RELATED APPLICATIONS

This application is a continuation-in-part of pending U.S. patent application Ser. No. 11/364,142 filed on Feb. 27, 2006, which is incorporated herein by reference.

BACKGROUND OF THE INVENTION

1. Field of the Invention

The present invention is directed generally to electronic design automation (EDA) tools used, for example, in the design of integrated circuits. More specifically, but without limitation thereto, the present invention is directed to a method and computer program for automatically configuring data representative of an integrated circuit design to generate different scenarios for performing static timing analysis on different portions of the integrated circuit design that may be much smaller than the overall design.

2. Description of Related Art

One measure of the performance of an integrated circuit is the maximum allowable clock frequency. Static timing analysis plays a vital role in facilitating the fast and reasonably accurate measurement of circuit timing that determines the maximum allowable clock frequency. Static timing analysis is a method of computing the expected timing of a digital circuit without requiring a full circuit simulation using simplified delay models. As a result of the simplification, the capability to estimate the effects of logical interactions between signals is limited. Nevertheless, static timing analysis has become a mainstay of integrated circuit design over the last few decades.

SUMMARY OF THE INVENTION

In various embodiments described below, a method and a computer program for configuring an integrated circuit design for static timing analysis include receiving module data representative of a hierarchy of modules in an integrated circuit design. A configuration item is selected from a list of configuration items for at least one of the modules. The module data is configured for the module according to the selected configuration item into a static timing analysis scenario for performing a static timing analysis of the configured module data.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted to facilitate a less obstructed view of the illustrated embodiments.

DETAILED DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

For complex multi-million gate designs typically found in Application-Specific Integrated Circuits (ASICs), platform ASICs, Field-Programmable Gate Arrays (FPGAs), and other large scale integrated circuits, the run time for a static timing analysis of the complete circuit design may become impractically large. The problem becomes even worse after timing and capacitance information generated by the layout process is backannotated to the netlist. On the other hand, a typical static timing analysis run during different phases of the design process is usually focused only on smaller details of the integrated circuit design that constitute only a fraction of the overall design or on a certain operating mode, such as a special functionality mode or a test mode that is limited to specific portions of the integrated circuit design. For these specific applications of a static timing analysis tool, it is usually not necessary to read and link the entire integrated circuit design and backannotated timing and capacitance information for each individual net and cell.

Because static timing analysis tools do not support the creation of different analysis configurations and the corresponding backannotation information in standard delay format (SDF) files and standard parasitic extraction format (SPEF) files within the same integrated circuit design, a different set of files must be generated manually for each analysis configuration, or scenario. For example, when identical hardmacros are used repeatedly in an integrated circuit design, it may be desirable to represent only one of them with a module library file and the other instances as "black boxes". Accordingly, the netlist of the integrated circuit design must be modified manually to give different names to the different hardmacro modules. The same is true for the corresponding backannotation information. Because the process of modifying netlists and other information in the integrated circuit design is a manual process, it is both time consuming and error prone. In addition, each scenario requires a complete static timing analysis run including reading in the entire integrated circuit design database, which may also be very time-consuming.

Figure 1:
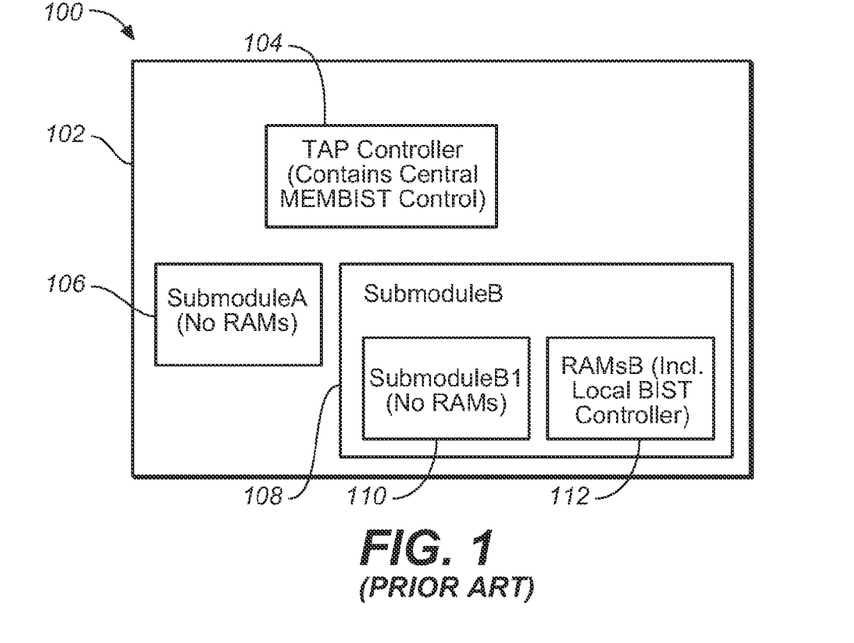
FIG. 1 illustrates a modular hierarchy for an integrated circuit design of the prior art.

FIG. 1 illustrates a modular hierarchy 100 for an integrated circuit design of the prior art. Shown in FIG. 1 are a top module 102, a control module 104, a submodule "A" 106, a submodule "B" 108, a submodule "B1" 110, and a random access memory (RAM) submodule 112.

In FIG. 1, the top module 102 includes information that defines all of the modules in an integrated circuit design. The information typically includes a netlist, a backannotation file, cell libraries, and other design data. The netlist defines the cells and interconnects within each of the modules in the integrated circuit design. The backannotation file provides timing information or parasitic capacitance and resistance information for the cells and interconnects in the netlist.

Each of the modules included in the top module 102 may also be referred to as a submodule. In this simplified example of a built-in self test (BIST) circuit, the top module 102 includes the control module 104, the submodule "A" 106, and the submodule "B" 108. The submodule "B" 108 includes the submodule "B1" 110 and the random access memory (RAM) submodule 112. The inclusion of modules within modules from the top level to the lowest level defines the modular hierarchy of an integrated circuit design.

Figure 2:
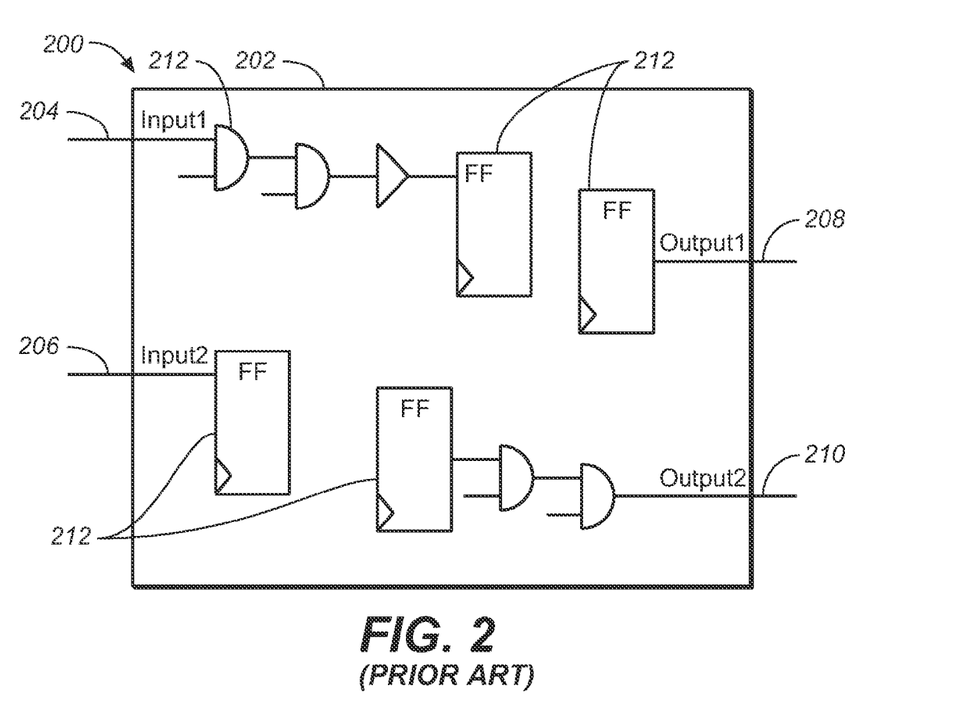
FIG. 2 illustrates a schematic diagram of an example of a submodule of FIG. 1 according to the prior art before conversion to a black box representation.

FIG. 2 illustrates a schematic 200 of an example of a submodule of FIG. 1 according to the prior art before conversion to a black box representation. Shown in FIG. 2 are a module 202, inputs 204 and 206, outputs 208 and 210, and cells 212. The module 202 is generally representative of a module that includes inputs, outputs, and a combination of cells such as gates and flip-flops operating on the inputs to generate the outputs.

Figure 3:
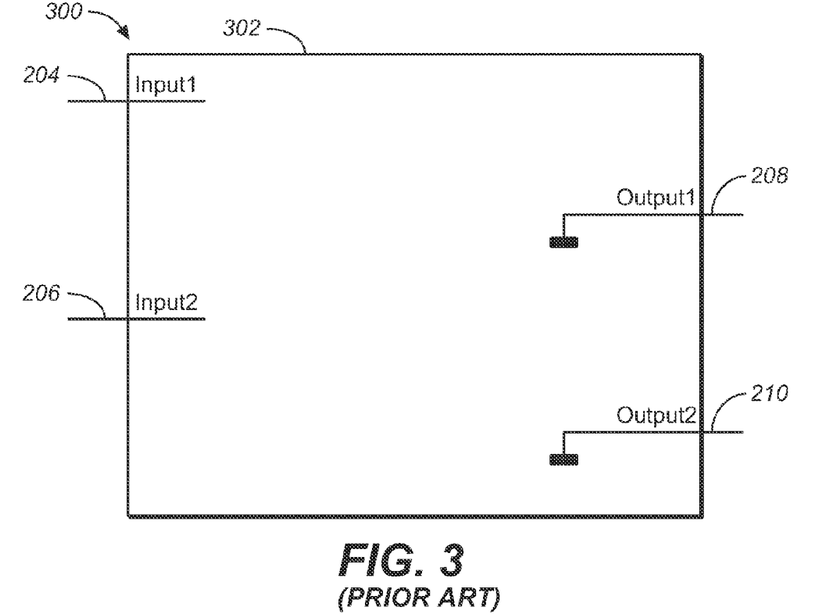
FIG. 3 illustrates a schematic diagram of the module of FIG. 2 after conversion to a black box representation according to the prior art.

FIG. 3 illustrates a schematic 300 of the module of FIG. 2 after conversion to a black box representation according to the prior art. Shown in FIG. 3 are a black box representation 302, inputs 204 and 206, and outputs 208 and 210.

The black box representation 300 is a useful tool for configuring the netlist data of an integrated circuit design to generate a scenario for static timing analysis that includes only the portion or mode of operation of the integrated circuit design that a design or test engineer may want to explore, advantageously avoiding committing the time and costs required to process the entire netlist. The black box representation 300 is typically a manually created replica of a module that omits all of the cells and interconnects inside the module. The inputs 204 and 206 are typically defined as open circuits, and the outputs 208 and 210 are typically defined as open circuits or a fixed voltage or logic level. A disadvantage of the black box representation 300 is that references to removed cells and interconnects in the netlist backannotation file will generally produce numerous errors in the static timing analysis that may interfere with estimating the circuit timing and interpreting the results.

Figure 4:
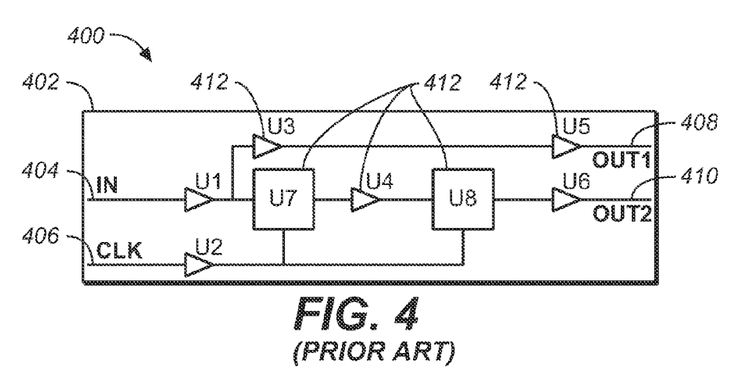
FIG. 4 illustrates a schematic diagram of an example of a submodule of FIG. 1 according to the prior art before conversion to an extracted timing model.

FIG. 4 illustrates a schematic diagram 400 of an example of a submodule of FIG. 1 according to the prior art before conversion to an extracted timing model representation. Shown in FIG. 4 are a module 402, inputs 404 and 406, outputs 408 and 410, and cells 412. The module 402 is generally representative of a module that includes inputs, outputs, and a combination of cells such as gates and flip-flops operating on the inputs to generate the outputs.

Figure 5:
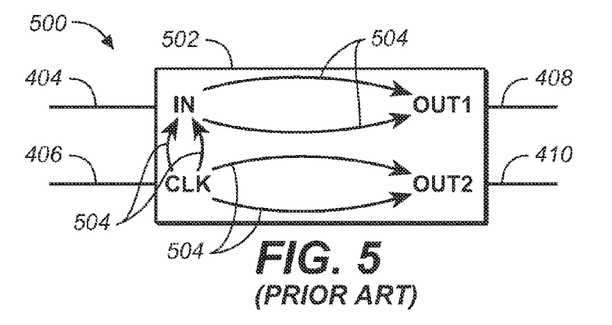
FIG. 5 illustrates a schematic diagram of the module of FIG. 4 after conversion to an extracted timing model representation according to the prior art.

FIG. 5 illustrates a schematic diagram 500 of the module of FIG. 4 after conversion to an extracted timing model representation according to the prior art. Shown in FIG. 5 are inputs 404 and 406, outputs 408 and 410, a timing model representation 502, and timing arcs 504.

The timing model representation 502 is an abstract view of timing at module boundaries that ignores cell information. The timing model representation 502 is typically generated from parasitic extraction information in standard delay format (SDF) files and standard parasitic extraction format (SPEF) files. The timing arcs 504 represent minimum and maximum delays between inputs and outputs.

Figure 6:
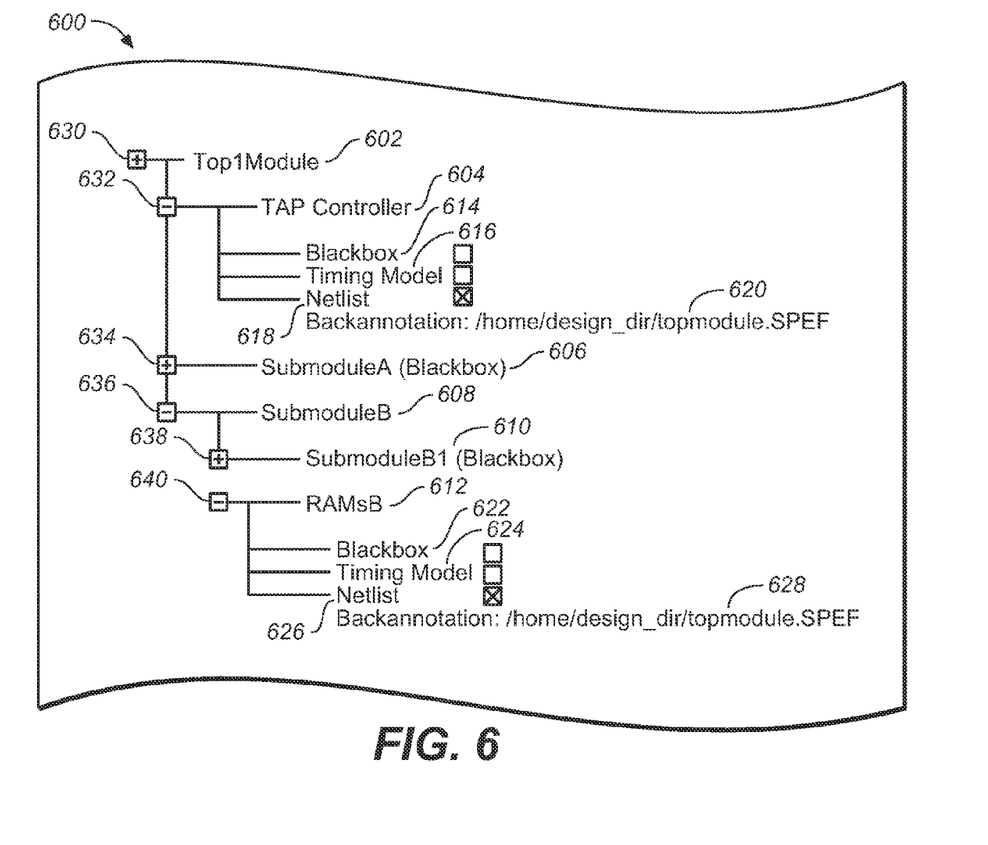
FIG. 6 illustrates a graphical user interface for a static timing analysis (STA) configuration tool to generate a scenario for the integrated circuit design of FIG. 1.

FIG. 6 illustrates a graphical user interface 600 for a static timing analysis (STA) configuration tool to generate a scenario for the integrated circuit design of FIG. 1. Shown in FIG. 6 are module names 602, 604, 606, 608, 610, and 612, configuration items 614, 616, 618, 620, 622, 624, 626, and 628, and expansion/reduction icons 630, 632, 634, 636, 638, and 640.

In FIG. 6, each of the module names 602, 604, 606, 608, 610, and 612 is prefixed by one of the expansion/reduction icons 630, 632, 634, 636, 638, and 640 to indicate whether submodules included in a selected module are to be displayed. For example, a "+" sign next to a module name may indicate that the selected module may be shown in expanded format to show all the submodules included in the selected module, while a "−" sign may indicate that the selected module may be shown in reduced format that omits the included submodules. Accordingly, the "+" sign next to a module name may be selected on the display by a pointing device such as a mouse to switch from the reduced format to the expanded format, and the "−" sign may be selected in the same manner to switch from the expanded format to the reduced format. In the illustrated embodiment, the expansion/reduction icon is a "+" or a "−"; however, other symbols may be used to indicate the expansion/reduction icons to practice various embodiments within the scope of the appended claims. Also, the fonts, style, and arrangement of the text and icons shown in the graphical user interface 600 may be varied according to well-known display techniques to practice other embodiments within the scope of the appended claims.

Each of the expansion/reduction icons 630, 632, 634, 636, 638, and 640 may be selected by the user to navigate the modular hierarchy from a single page display through complex netlists while maintaining an overview of the high level organization of the integrated circuit design.

In the example of FIG. 6, the top module 602 and module 608 include only other modules, and the modules 606 and 610 are represented as black boxes by default. The user may use a pointing device to check the appropriate boxes on the display among the configuration items 614, 616, 618, 620, 622, 624, 626, and 628 to select how the module data for the modules 604 and 612 is to be configured into a scenario for performing a static timing analysis of the integrated circuit design. In the illustrated embodiment, the modules 604 and 612 are to be configured for static timing analysis from the netlist and a corresponding backannotation file located at "/home/design_dir/topmodule.SPEF". In one embodiment, each list of configuration items includes a black box representation, a timing model representation, a netlist, and a backannotation file. In other embodiments, other configuration items may be included for configuring a scenario to suit specific applications within the scope of the appended claims.

Figure 7:
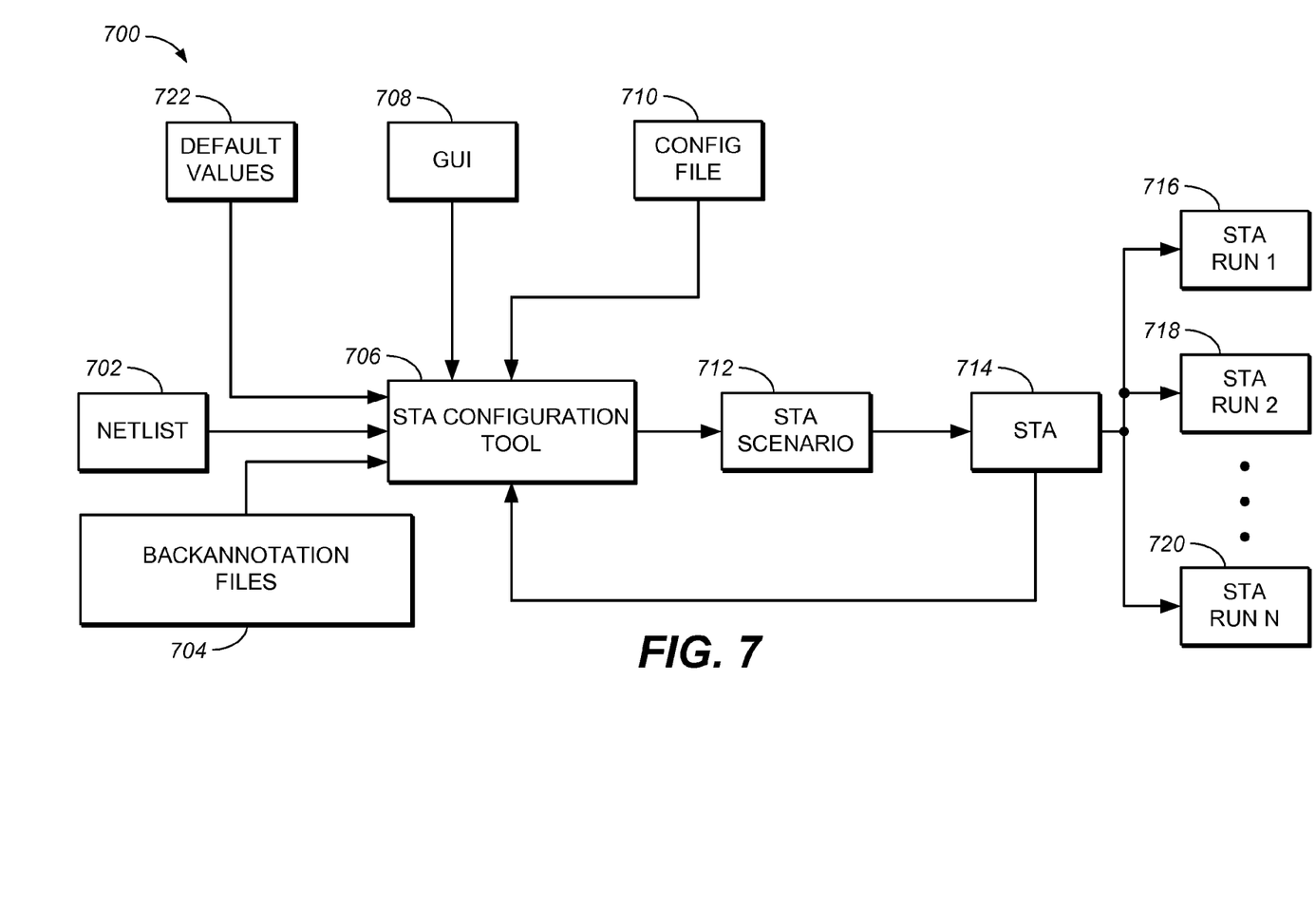
FIG. 7 illustrates a block diagram of an embodiment of a static timing analysis (STA) configuration tool including the graphical user interface of FIG. 6.

FIG. 7 illustrates a block diagram 700 of an embodiment of a static timing analysis (STA) configuration tool including the graphical user interface of FIG. 6. Shown in FIG. 7 are a netlist 702, backannotation files 704, a STA configuration tool 706, a graphical user interface (GUI) 708, a configuration file 710, a STA scenario 712, a static timing analyzer (STA) 714, static timing analysis (STA) output scenario reports 716, 718, and 720, and default values 722.

In FIG. 7, the netlist 702 defines the cell and interconnect data for each module in an integrated circuit design, for example, the modular hierarchy of FIG. 1. The backannotation file 704 provides parasitic capacitance and resistance information for the cells and interconnects in the netlist 702. The STA configuration tool 706 receives the netlist 702 and the backannotation file 704 and stores the information so that multiple scenarios may be generated from the module data without an additional step of receiving the same module data each time a scenario is generated.

The graphical user interface (GUI) 708 may be used to select the configuration of the module data from the list of configuration items for performing a static timing analysis. The default values 722 may be a separate input file that specifies the default configuration items for the modules in the integrated circuit design so that the user need only select those configuration items that have to be changed to create a scenario. In another embodiment, the configuration items for each module may be stored in the configuration file 710. The STA configuration tool 706 configures the module data from the selected configuration items according to well-known programming techniques to generate the STA scenario 712. For example, when a black box representation or a timing model representation is selected for a module, the backannotation files are filtered to remove references to cells and interconnects inside the module. This step avoids compilation errors due to references to cells in the module in the backannotation files that may interfere with the static timing analysis. The STA configuration tool 706 generates the STA scenario 712 that includes the configured module data and the filtered backannotation files selected from the GUI 708 or the configuration file 710. The STA scenario 712 has the same format as the netlist 702 and the backannotation files 704. The static timing analyzer (STA) 714 performs a static timing analysis on the STA scenario 712 and produces one of the static timing analysis (STA) output scenario reports 716, 718, and 720. The user may then select another configuration from the GUI 708 or another configuration file 710 to generate another scenario to perform another static timing analysis, and so on. In this manner, the user may perform a static timing analysis for a variety of scenarios, advantageously avoiding the time and likelihood of error inherent in manually editing and renaming netlist and backannotation files.

In one embodiment, a method for configuring an integrated circuit design for static timing analysis includes the following steps:

receiving module data representative of a hierarchy of modules in an integrated circuit design;

selecting a configuration item from a list of configuration items for at least one of the modules; and configuring the module data for the module from the selected configuration item into a static timing analysis scenario for performing a static timing analysis of the configured module data.

Figure 8:
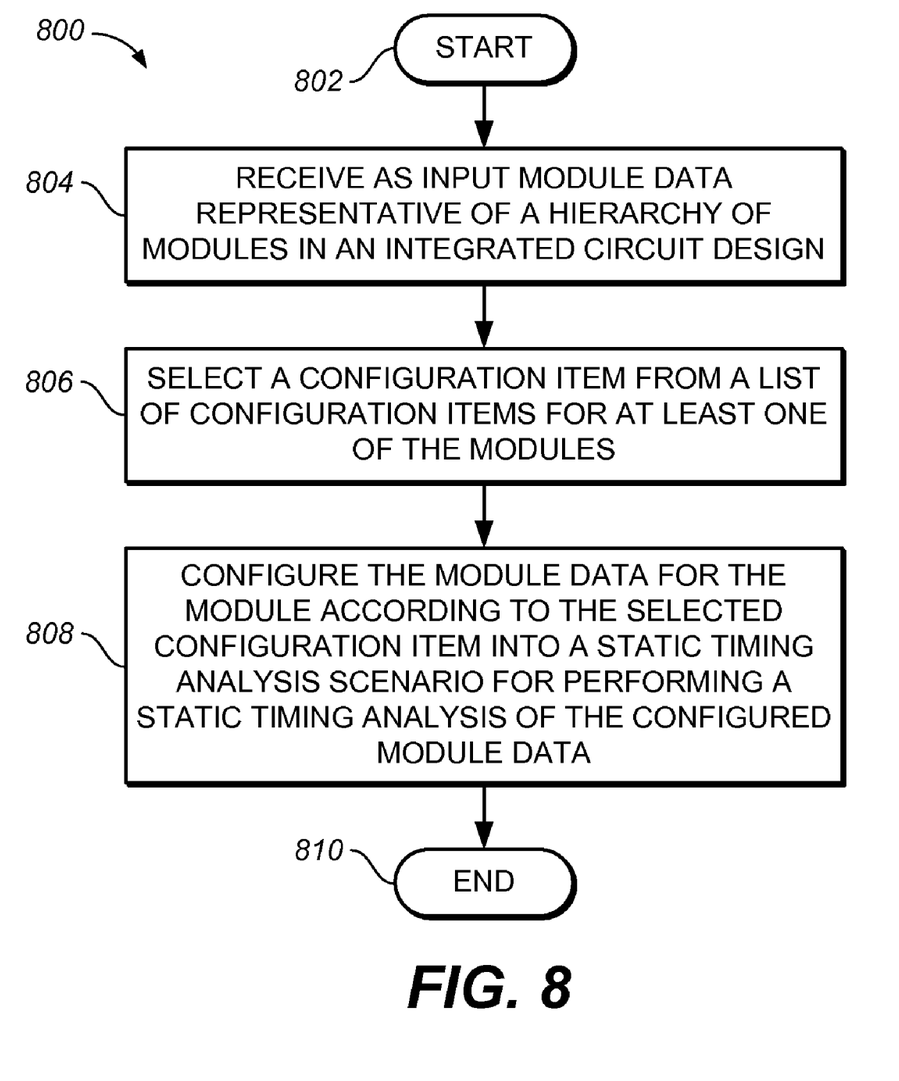
FIG. 8 illustrates a concise flow chart for a method of configuring netlist data to create a scenario for the static timing analysis (STA) configuration tool of FIG. 7.

FIG. 8 illustrates a concise flow chart for a method of configuring netlist data to create a scenario for the static timing analysis (STA) configuration tool of FIG. 7.

Step 802 is the entry point of the flow chart 800.

In step 804, module data representative of a hierarchy of modules in an integrated circuit design is received as input according to well-known integrated circuit design techniques. For example, the module data may include a netlist that defines cells and interconnects in each of the modules and backannotation files that include parasitic impedances of the cells and interconnects such as resistance, capacitance, and inductance.

The module data is copied into storage so that it may be used to generate multiple scenarios without an additional step of receiving the same module data. In other embodiments, automated tools for test insertion and pattern generation may be included in the module data, for example, for built-in self test (BIST) circuits. Certain functional or test modes of a design usually run only with a specified and fixed test configuration of modules in the integrated circuit design. For example, memory BIST usually only exercises RAMs, surrounding BIST control logic, and a central memory BIST controller. Accordingly, a test configuration file may be used to indicate the portions of the design that are to be included completely, that is, including all gates and backannotation data, and those portions of the design that may be black boxed. The test configuration file may be generated along with the test vectors, for example, for memory BIST, by the same tools that generate the test vectors.

In this manner a complete set of design data, including different representations and backannotation information of even the same modules, if they are available, may be copied into storage. The user can interactively choose which representation (library file, gate level netlist, etc.) and backannotation data (none, SDF, SPEF, etc.) to use for each scenario, not only for each module, or block, but also for different instantiations of the same module in the integrated circuit design.

In step 806, a configuration item is selected from a list of configuration items for at least one of the modules. The list of configuration items may include, for example, a netlist and at least one of a backannotation file, a black box representation, and a timing model representation. The configuration items may be selected, for example, by a user from a graphical user interface (GUI) or from a pre-defined configuration file for each scenario to be analyzed.

In step 808, the module data for the module is configured from the selected configuration item into a static timing analysis scenario for performing a static timing analysis of the configured module data. In one embodiment, when a black box representation or a timing model representation is selected from a list of configuration items, the cells and interconnects in the module are removed from the module netlist except for inputs and outputs, which are tied to default impedances or voltage levels.

The backannotation data is filtered in the scenario to remove references to cells and interconnects that were removed in the configured module data. For standardized test modes that are independent of the design, for example, a JTAG Boundary Scan Test, the appropriate configurations may be generated automatically.

The static timing analysis scenario has the same format as the netlist and the backannotation data so that the scenario may be processed by static timing analyzer in a conventional manner.

Step 810 is the exit point of the flow chart 800.

Figure 9:
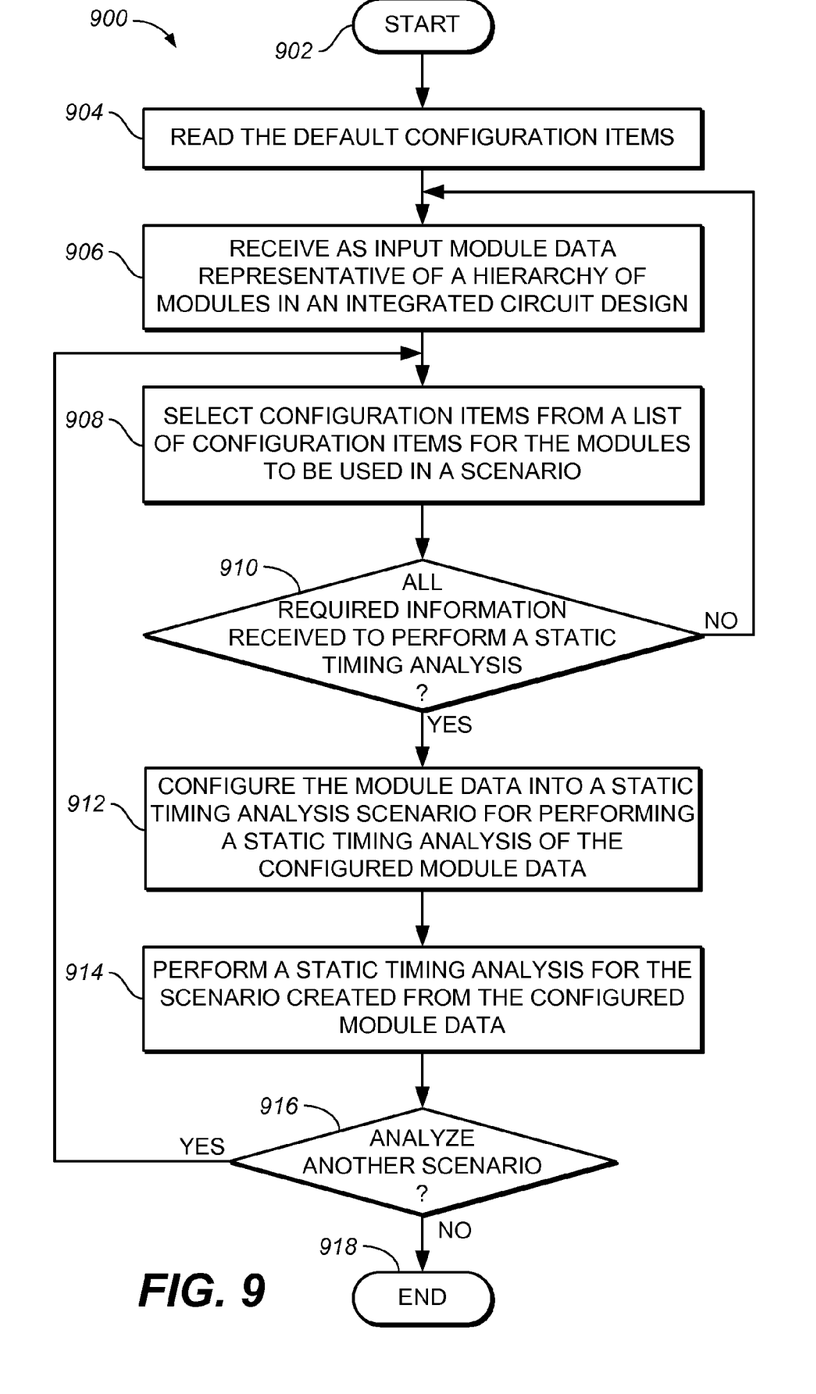
FIG. 9 illustrates a detailed flow chart for a method of configuring netlist data to create a scenario for the static timing analysis (STA) configuration tool of FIG. 7.

FIG. 9 illustrates a detailed flow chart for a method of configuring netlist data to create a scenario for the static timing analysis (STA) configuration tool of FIG. 7.

Step 902 is the entry point of the flow chart 900.

In step 904, the default configuration items may be read from a separate input file so that the user need only enter those configuration items that are to be changed to create a scenario. For example, the default configuration values may be set to select the netlist for all modules.

In step 906, module data representative of a hierarchy of modules in an integrated circuit design is received as input according to well-known integrated circuit design techniques.

In step 908, configuration items are selected from a list of configuration items for the modules to be used in a scenario. The configuration items may be selected for each scenario to be analyzed, for example, by a user from a graphical user interface (GUI) or from a pre-defined configuration file.

In step 910, the module data is checked to verify that all required information has been received to perform a static timing analysis. For example, if there is no cell library available for a module which was chosen to be part of the scenario, or if a portion of backannotation data is missing that was selected for the scenario, then an error message would be generated, and the flow chart would continue from step 906. Otherwise, the flow chart continues from step 912.

In step 912, the module data is configured into a static timing analysis scenario for performing a static timing analysis of the configured module data. In the black box representation and the timing model representation, cells and interconnects are removed from the module netlist for the scenario except for inputs and outputs, which are tied to default impedances or voltage levels. The backannotation data is filtered for the scenario to remove references to cells and interconnects that were removed in the configured module data.

In step 914, a static timing analysis is performed for the scenario created from the configured module data according to well-known techniques.

In step 916, the user may analyze another scenario by going back to step 908. Otherwise, the flow chart continues from step 918.

Step 918 is the exit point of the flow chart 900.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims. The flow charts described above may also be automated by instructions for execution on a computer and may be embodied in a disk, a CD-ROM, and other computer readable media according to well-known computer programming techniques.

The method described above advantageously avoids the necessity of manually creating analysis scenarios from multiple edited netlists and backannotation files, etc., thereby saving time and engineering resources and minimizing the risk of introducing errors inherent in manual operations.

The specific embodiments and applications thereof described above are for illustrative purposes only and do not preclude modifications and variations that may be made within the scope of the following claims.

What is claimed is:

1. A processor-based method for conducting a static timing analysis of an integrated circuit design, the method comprising the steps of:
receiving with the processor an integrated circuit design defined by modules and submodules,
producing and displaying with the processor a hierarchical representation of the modules and submodules of the integrated circuit design,
for each submodule in the hierarchical representation, and using an interface connected to the processor, indicating a desired one only of a selection of representations of the submodule, where the representations comprise,
  (a) a black box approximation comprising input and output parameters for the submodule but no cell and interconnect information for the submodule,
  (b) a timing model comprising timing at boundaries of the submodule but no cell and interconnect information for the submodule, and
  (c) a netlist comprising cell and interconnect information for the submodule,
generating with the processor a static timing analysis scenario file, where for each submodule the static timing analysis scenario file includes only the selected representation of the submodule, and
performing the static timing analysis using the static timing analysis scenario file as input.

2. The processor-based method of claim 1, further comprising the step of using as a default in the static timing analysis scenario file the black box approximation for each submodule for which a specific indication is not made.

3. The processor-based method of claim 1, further comprising the step of selectively expanding and collapsing a hierarchical view of all, none, or some of the submodules and their indicated representations.

4. The processor-based method of claim 1, wherein the netlists further comprise backannotation information for the submodules.

5. A non-transitory computer readable storage medium tangibly embodying instructions for a processor that when executed by the processor implement a method comprising steps of:
receiving with the processor an integrated circuit design defined by modules and submodules,
producing and displaying with the processor a hierarchical representation of the modules and submodules of the integrated circuit design,
for each submodule in the hierarchical representation, and using an interface connected to the processor, indicating a desired one only of a selection of representations of the submodule, where the representations comprise,
  (a) a black box approximation comprising input and output parameters for the submodule but no cell and interconnect information for the submodule,
  (b) a timing model comprising timing at boundaries of the submodule but no cell and interconnect information for the submodule, and
  (c) a netlist comprising cell and interconnect information for the submodule,
generating with the processor a static timing analysis scenario file, where for each submodule the static timing analysis scenario file includes only the selected representation of the submodule, and
performing the static timing analysis using the static timing analysis scenario file as input.

6. The non-transitory computer readable storage medium of claim 5, further comprising the step of using as a default in the static timing analysis scenario file the black box approximation for each submodule for which a specific indication is not made.

7. The non-transitory computer readable storage medium of claim 5, further comprising the step of selectively expanding and collapsing a hierarchical view of all, none, or some of the submodules and their indicated representations.

8. The non-transitory computer readable storage medium of claim 5, wherein the netlists further comprise backannotation information for the submodules.

9. A static timing analysis scenario file generator comprising:
- a processor for receiving an integrated circuit design that is defined by modules and submodules,
- the processor further for producing and displaying a hierarchical representation of the modules and submodules of the integrated circuit design,
- for each submodule in the hierarchical representation, and using an interface connected to the processor, indicating a desired one only of a selection of representations of the submodule, where the representations comprise,
  - (a) a black box approximation comprising input and output parameters for the submodule but no cell and interconnect information for the submodule,
  - (b) a timing model comprising timing at boundaries of the submodule but no cell and interconnect information for the submodule, and
  - (c) a netlist comprising cell and interconnect information for the submodule,
- the processor further for generating the static timing analysis scenario file, where for each submodule the static timing analysis scenario file includes only the selected representation of the submodule, and
- performing the static timing analysis using the static timing analysis scenario file as input.

10. The static timing analysis scenario generator of claim 9, further comprising the processor for using as a default in the static timing analysis scenario file the black box approximation for each submodule for which a specific indication is not made.

11. The static timing analysis scenario generator of claim 9, further comprising the processor for selectively expanding and collapsing a hierarchical view of all, none, or some of the submodules and their indicated representations.

12. The static timing analysis scenario generator of claim 9, wherein the netlists further comprise backannotation information for the submodules.

* * * * *